United States Patent [19]

Grunthaner et al.

[11] Patent Number: 5,091,335
[45] Date of Patent: Feb. 25, 1992

[54] MBE GROWTH TECHNOLOGY FOR HIGH QUALITY STRAINED III-V LAYERS

[75] Inventors: Frank J. Grunthaner, Glendale; John K. Liu, Pasadena; Bruce R. Hancock, Altadena, all of Calif.

[73] Assignee: The United States of America as represented by the Administrator of the National Aeronautics and Space Administration, Washington, D.C.

[21] Appl. No.: 506,137

[22] Filed: Mar. 30, 1990

[51] Int. Cl.$^5$ .................... H01L 21/203; H01L 29/38
[52] U.S. Cl. ..................... 437/108; 156/611; 156/612; 437/105; 437/107; 437/110; 437/111; 437/133; 437/945; 437/936; 148/22; 148/25; 148/DIG. 5; 148/DIG. 18
[58] Field of Search .......... 148/DIG.5, 18, 22, 25, 148/48, 56, 65, 72, 97, 110, 119, 129, 160, 169, 33, 33.1, 33.4; 156/610–615; 427/255.1, 248.1; 437/81, 85, 105, 107, 108, 110, 111, 126, 133, 247, 936, 939, 945, 946, 949, 976

[56] References Cited

U.S. PATENT DOCUMENTS

| | | | |
|---|---|---|---|
| 4,058,430 | 11/1977 | Suntola et al. | 156/611 |
| 4,575,462 | 3/1986 | Dobson et al. | 156/610 |
| 4,829,022 | 5/1989 | Kobayashi et al. | 437/107 |
| 4,833,101 | 5/1989 | Fujii | 437/107 |
| 4,843,029 | 6/1989 | Joyce et al. | 437/133 |
| 4,933,300 | 6/1990 | Koinuma et al. | 437/110 |

OTHER PUBLICATIONS

Takeda et al., "Atomic-Layer Epitaxy . . . ", Ext. Abs. 17th Conf. Solid State Dev. Mat., Tokyo, 1985, pp. 221-224.
Briones et al., ". . . Modulated Molecular Beam Epitaxy", Jpns. J. Appl. Phys., vol. 26, No. 7, Jul. 1987, pp. L1125-L1127.
Sakaki et al., ". . . Insertion of Smoothing Period in Molecular Beam Epitaxy", Jpns. J. Appl. Phys., vol. 24, No. 6, Jun. 1985, pp. L417-L420.
Pessa et al., "Atomic Layer Epitaxy . . . ", J. Appl. Phys., vol. 54, No. 10, Oct. 1983, pp. 6047-6050.
Gossard et al., "Epitaxial Structures With Alternate-Atomic-Layer Composition Modulation", Appl. Phys. Lett., vol. 29, No. 6, 15 Sep. 1976, pp. 323-325.
Miller et al., ". . . Interruption During the Growth of Single GaAs . . . ", Appl. Phys. Lett., vol. 49, No. 19, 10 Nov. 1986, pp. 1245-1247.

Primary Examiner—Robert Kunemund
Attorney, Agent, or Firm—Thomas H. Jones; John R. Manning

[57] ABSTRACT

III-V films are grown on large automatically perfect terraces of III-V substrates which have a different lattice constant, with temperature and Group II and V arrival rates chosen to give a Group III element stable surface. The growth is pulsed to inhibit Group III metal accumulation to low temperature, and to permit the film to relax to equilibrium. The method of the invention 1) minimizes starting step density on sample surface; 2) deposits InAs and GaAs using an interrupted growth mode (0.25 to 2 mono-layers at a time); 3) maintains the instantaneous surface stoichiometry during growth (As-stable for GaAs, In-stable for InAs); and 4) uses time-resolved RHEED to achieve aspects (1)-14 (3).

16 Claims, 1 Drawing Sheet

MBE GROWTH TECHNOLOGY FOR HIGH QUALITY STRAINED III-V LAYERS

ORIGIN OF THE INVENTION

The invention described herein was made in the performance of work under a NASA contract, and is subject to the provisions of Public Law 96-517 (35 U.S.C. 202) in which the Contractor has elected not to retain title.

TECHNICAL FIELD

The invention relates to III-V devices employing strained layers, and, more particularly, to a method for growing such strained layers.

BACKGROUND ART

Lattice-mismatched materials find use in a variety of devices employing strained layers, such as opticallyaddressed spatial light modulators, high electron mobility transistors which operate at room temperature, infrared sensors, and lasers. Lattice-mismatched materials show different growth modes as compared to such lattice-matched materials as GaAs/AlGaAs. Thin films of such materials evidence extensive dislocations and a very rough surface morphology if grown continuously, as is current conventional practice.

In a particular example, it is desired to achieve the growth of high quality (low defect density) InAs strained layer films on GaAs (100) substrates. Films are required which are ten to thirty monolayers thick for certain device applications, but existing technologies give only one monolayer, before generation of extensive dislocations.

The growth of lattice-mismatched materials is extremely difficult because the system wants to relieve the developing lattice strain (in the course of film growth) by spontaneously injecting misfit dislocations. These dislocations are generally accompanied by other point defects and are electrically active. The resulting material has very poor electrical properties (low carrier lifetime, Fermi level pinning). This is the general situation obtained in classical MBE (molecular beam epitaxial) growth of InAs films on GaAs (100) surfaces. These films have a lattice mismatch of more than 7.4% (InAs>GaAs). Classical MBE growth refers to the continuous deposition of elemental In on a GaAs surface which is flooded by an excess $As_4$ beam. The elemental In and As react together on the surface at elevated temperatures ($>200°$ C.) to form the InAs compound.

STATEMENT OF THE INVENTION

Accordingly, it is an object of the invention to grow one lattice-mismatched III-V film on a substrate of another III-V material.

It is an additional object of the invention to grow such films free of dislocations.

It is yet another object of the invention to extend the range of film thicknesses achievable with low defect density beyond the predicted critical thickness of one monolayer to values between 10 and 30 monolayers.

In accordance with the invention, one lattice-mismatched III-V film is grown on a substrate of another III-V material. As used herein, "substrate" includes not only a wafer surface, but also another layer or film.

The method of the invention involves what is termed a discontinuous or interrupted growth mode in molecular beam epitaxy, to control the arrival rate of the various elemental species impinging on the sample surface. These elemental species react to grow the resulting film. In the case of InAs growth on GaAs, the InAs film is grown under Instable conditions (slight excess of In on the surface). Only $\frac{1}{4}$ to 2 monolayers of InAs are grown at a time, with periods of interruption to permit the surface to establish a steady state configuration with the recently grown film. In this manner, multilayer films are grown.

DETAILED DESCRIPTION OF THE INVENTION

Figure 1:
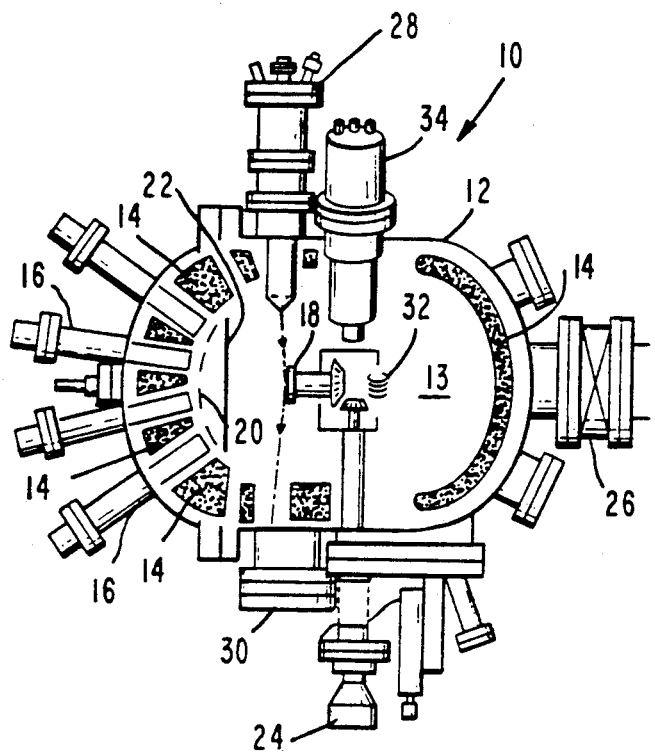
FIG. 1 is a schematic view of molecular beam epitaxy apparatus useful in the practice of the invention.

Referring now to the drawings, wherein like reference numerals designate like elements throughout, FIG. 1 depicts molecular beam epitaxy (MBE) apparatus 10 useful in the practice of the invention. Such apparatus is commercially available, though customized to particular needs, such as from Riber (Edison, NJ).

Essentially, the apparatus 10 comprises a housing 12, which defines a chamber 13. Within the housing 12 is a cryopanel 14, or liquid nitrogen shroud, surrounding the entire deposition area 13 to ensure clean, high vacuum. The cryopanel shrouding also isolates each effusion cell 16 to prevent thermal interference and cross contamination between cells.

A plurality of effusion cells 16 are used to introduce specific elements. Typically, heating means (not shown) in each cell 16 are used to generate a vapor of the element in that cell, which is directed toward a sample substrate 18. Individual shutters 20 control the extent of exposure of the substrate 18 to a particular element emanating from a cell 16. The shutters 20 controllably rotate into and out of position to block or open the aperture from the effusion cells 16. A main shutter 22 isolates the substrate 18 from all effusion cells 16.

The relative position of the sample 18 is controlled by a position control manipulator 24, which the operator controls. The sample is introduced into the apparatus 10 through a gate valve 26, such as by a track means (not shown).

A RHEED (reflective high energy electron diffraction) gun 28 is positioned to provide grazing angle analysis of the substrate 18. A fluorescent screen 30 is positioned to intercept scattered electrons from the sample 18 and provide real-time analysis of the nature of the film being grown.

An ion gauge 32 is used to measure the relative intensity of the molecular beams when the gauge is rotated into the growth position (done with the position control manipulator 24).

A quadrupole mass spectrometer 34 is used to measure the background chamber gas impurities.

An ultra-high vacuum ($P < 1 \times 10^{-10}$ Torr base pressure) is pulled on the chamber 13, as is conventional.

In the novel approach of the invention, five different aspects of the problem are addressed to achieve the growth of electrical quality InAs/GaAs structures. These reduce to real-time control of the surface morphology during growth using RHEED intensity analysis and deposition of the InAs in a discontinuous or interrupted procedure. The control of surface morphology is predicated on the inference that steps and kinks at the edges of extended terraces act as nucleation sites for the generation of dislocations, or of InAs faceted islands. The smoothest starting surface therefore has the fewest steps or kinks and shows the longest terrace lengths. This condition is established by annealing the sample starting surface in As. flux while monitoring the RHEED specular beam intensity. When the intensity is a maximum, the smoothest readily accessible surface has been achieved.

The discontinuous or interrupted growth mode is used to take advantage of the capability of MBE to precisely control the arrival rate of the elemental species impinging on the sample surface which react to grow the resulting film. Typical MBE growth conditions call for a high excess of $As_4$ (two to ten times greater than required by stoichiometry) to be continuously delivered to the sample surface. In this case, the growth rate is controlled by the arrival of the Group III element (Ga or In). This approach rapidly roughens the surface in time and gives a three-dimensional morphology with extreme electrical and structural defects. This is related to the low surface mobility of In on GaAs under strongly $As_4$ stabilized conditions, and to the tendency for InAs to grow preferentially on InAs as well as InAs facets.

In the approach of the invention, the InAs film is grown under In-stable conditions (slight excess of In on surface). By this is meant up to about 10% excess of In over stoichiometric In. Preferably, however, the excess In is maintained as close to stoichiometry as possible, to minimize defects. Too much In balls up, causing cluster defects, which adversely affect electrical properties. More than stoichiometric As again quenches the In surface mobility, giving clustered growth with attendant dislocations and electrical defects.

The process of the invention gives very high surface migration rates, and a very uniform, smooth over-layer. Unfortunately, if the films are grown continuously under these conditions, an In excess in the film would be achieved which would also destroy the structural and electrical quality of the film. Therefore, $\frac{1}{4}$ to 2 monolayers of InAs are variously deposited for time periods of a few seconds. The In and As shutters are then closed to interrupt the In growth and to allow the surface to equilibrate with the recently deposited film.

Figure 2:
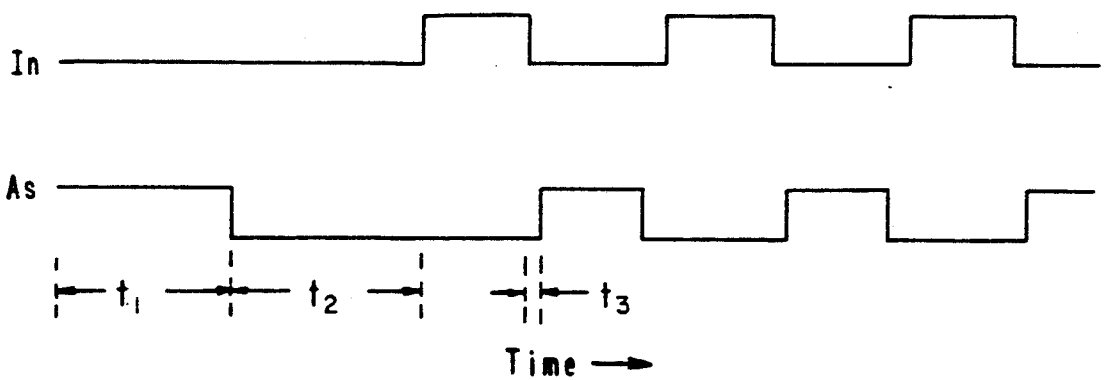
FIG. 2 is a time plot of shutter opening and closing, depicting a sequence of depositing a plurality of InAs layers.

FIG. 2 depicts the process of the invention, first smoothing the surface with As (As shutter on; $t_1$), then turning the As shutter off for a period of time to permit equilibration of As surface stoichiometry ($t_2$), then turning the In shutter on for a period of time, then turning the In shutter off, then delaying for a period of time to establish InAs stoichiometry ($t_3$), then turning on the $As_4$ shutter. The In and As. shutters are alternately opened and closed, with a time delay ($t_3$) between turning off one shutter and opening the other.

The control of the In and As shutters is mechanically limited. Accordingly, precise control of In and As is achieved by opening the shutters for the minimum time possible, while controlling the flux of the elemental gun behind the shutter by temperature control. An increase in cell temperature of 5° C. doubles the flux.

In the typical Riber apparatus, the minimum shutter opening and closing times are 120 msec each. Other commercial apparatus may vary.

The low pressure of background arsenic consumes the excess indium, returning the film to stoichiometry. While the growth has been interrupted, the atoms of the surface translate rapidly, giving rise to a smoother film. This method minimizes the evolving step density if the temperatures are appropriately chosen, and consequently, the film approaches a non-equilibrium or metastable configuration. Using the RHEED to monitor the evolving crystallography of the deposited film, the next layer deposition sequence is reinitiated as soon as the RHEED specular beam intensity is a maximum and the surface lattice constant becomes undistinguishable from bulk GaAs. The time constant for this film morphology recovery or annealing sequence is in the range of a few seconds to one to two minutes.

The interrupted sequence therefore makes it possible to grow In-stable InAs films (or other III-stable III-V films), recover the film stoichiometry, let the film strain relax in the direction of smoother films (lower entropy), and maximize the average terrace length for the next film deposition step. The use of RHEED makes it possible for the experimenter to control stoichiometry without compromising the layer-by-layer growth mode needed for high quality interfaces.

This approach reduces the variation in thickness of strained quantum wells, giving better interface quality, and strongly impacts the defect density in the film and/or the interfaces. This should give rise to lower concentrations of dislocations and other near-interfacial electrically active defects.

Reasonable electrical quality in these InAs/GaAs multilayers will make possible a series of new electronic structures by breaking the conventional perception about the lattice-mismatched problem. Lattice mismatched materials give new experimental opportunities for design of electronic properties through band gap engineering as needed.

This approach supports a narrow band gap system buried in GaAs which is ideal for optically addressed spatial light modulator structures. The large band offset in the conduction band between InAs and GaAs should make possible HEMT structures with strong z-axis confinement. Since the starting InAs has a high electron mobility intrinsically, and since strain should effect the inter-band alignment which gives rise to ballistic electron scattering, this material should give rise to two-dimensional electron confinements and very high mobilities in thin quantum well structures.

The experimental method of independently assessing the stoichiometry, reconstruction and morphology of the evolving film using RHEED as a primary in situ characterization probe is applicable to many other material systems showing lattice mismatch, such as GaAs/InAs, GaAs/Si, InAs/Si, $InSb_xAs_{1-x}/GaSb_1As_{1-y}$, and AlAs/InAs.

As indicated above, the number of monolayers grown depends on substrate temperature and flux of elements. This is easily determined by monitoring RHEED specular intensity, which is maximized for a given monolayer deposition.

The period of time that all shutters are closed is also determined by RHEED analysis. When the specular intensity reaches a maximum value, the shutters are kept closed for about three times the time it took to reach maximum intensity, keeping the substrate temperature constant.

It is preferred that the substrate temperature be maintained at as low a value as possible. In the case of InAs formation, the temperature may range from about 250° to 575° C., with times of shutter cessation ranging from about 5 to 90 sec, the shorter times being associated with the higher temperatures. At a temperature of 450° C., a time of shutter cessation of about 10 to 15 sec is employed; 30 monolayers of InAs on GaAs have been grown under such conditions.

We claim:

1. A method for growing a film comprising multiple high quality strained layers comprising a first III-V compound on a substrate comprising a second III-V compound in molecular beam epitaxy apparatus, said substrate having a sufficiently different lattice parameter than said III-V layer to generate strain in said III-V layers, said method comprising:
   (a) forming a layer of said first III-V material having a slight excess of III-component to maintain a metal-stabilized surface reconstruction while forming about ¼ to 2 monolayers thick of said first III-V material on said substrate;
   (b) ceasing formation of said layer for a period of time;
   (c) repeating steps (a) and (b) until said film of the desired thickness is grown.

2. The material of claim 1 wherein said III-V material consists essentially of a material selected from the group consisting of InAs, AlAs, GaAs, and $InSb_xAs_{1-x}$.

3. The method of claim 2 wherein said III-V material grown on said substrate evidences lattice mismatch, said III-V layer/substrate combinations selected from the group consisting of InAs/GaAs, GaAs/InAs, GaAs/Si, InAs/Si, $InSb_xAs_{1-x}$/$GaSb_yAs_{1-y}$, and AlAs/InAs.

4. The method of claim 1 wherein said time period is sufficient to permit the surface of said III-V layer to epitaxially orient with the layer underneath.

5. The method of claim 4 wherein said time period ranges from a few seconds to about two minutes.

6. The method of claim 4 wherein RHEED analysis is used to determine the surface lattice constant of said III-V layer and said layer formation is reinitiated when said surface lattice constant becomes indistinguishable from said substrate.

7. The method of claim 1 wherein said substrate is maintained at a temperature ranging from about 250° to 575° C.

8. The method of claim 7 wherein said substrate is maintained at as low a temperature as possible within said range.

9. The method of claim 1 in which steps (a)–(c) are repeated for the deposition of a superlattice interlayer as required to create a multilayer or quantum well structure of the appropriate thickness.

10. A method for growing a film comprising multiple high quality strained InAs layers on a GaAs substrate in molecular beam epitaxy apparatus comprising:
    (a) forming a layer of InAs material having a slight excess of In to maintain an In-stabilized surface reconstruction while forming about ¼ to 2 monolayers thick of said InAs material on said substrate;
    (b) ceasing formation of said layer for a period of time;
    (c) repeating steps (a) and (b) until said film of the desired thickness is grown.

11. The method of claim 10 in which steps (a)–(c) are repeated for the deposition of a superlattice interlayer as required to create a multilayer or quantum well structure of the appropriate thickness.

12. The method of claim 10 wherein said time period is sufficient to permit the surface of said InAs layer to epitaxially orient with the layer underneath.

13. The method of claim 12 wherein said time period ranges from a few seconds to about two minutes.

14. The method of claim 12 wherein RHEED analysis is used to determine the surface lattice constant of said InAs layer and said layer formation is reinitiated when said surface lattice constant becomes indistinguishable from said substrate.

15. The method of claim 10 wherein said substrate is maintained at a temperature ranging from about 250° to 575° C.

16. The method of claim 15 wherein said substrate is maintained at as low a temperature as possible within said range.

* * * * *